(12) United States Patent
Bluck et al.

(10) Patent No.: US 12,077,851 B2
(45) Date of Patent: Sep. 3, 2024

(54) CREATION OF DISTRIBUTED VOIDS IN THIN FILMS

(71) Applicant: INTEVAC, INC., Santa Clara, CA (US)

(72) Inventors: Terry Bluck, Santa Clara, CA (US); Samuel D. Harkness, IV, Albany, CA (US)

(73) Assignee: INTEVAC, INC., Santa Clara, CA (US)

( * ) Notice: Subject to any disclaimer, the term of this patent is extended or adjusted under 35 U.S.C. 154(b) by 452 days.

(21) Appl. No.: 17/306,054

(22) Filed: May 3, 2021

(65) Prior Publication Data
US 2021/0355579 A1   Nov. 18, 2021

Related U.S. Application Data

(60) Provisional application No. 62/704,317, filed on May 4, 2020.

(51) Int. Cl.
| | | |
|---|---|---|
| C23C 14/58 | (2006.01) | |
| C03C 17/34 | (2006.01) | |
| C23C 14/04 | (2006.01) | |
| H04M 1/02 | (2006.01) | |

(52) U.S. Cl.
CPC ...... *C23C 14/5873* (2013.01); *C03C 17/3411* (2013.01); *C23C 14/042* (2013.01); *H04M 1/0283* (2013.01); *C03C 2217/425* (2013.01); *C03C 2217/45* (2013.01)

(58) Field of Classification Search
CPC .............. C23C 14/5873; C23C 14/042; C03C 17/3411; C03C 2217/425; C03C 2217/45; C03C 2217/47; C03C 17/22; H04M 1/0283
See application file for complete search history.

(56) References Cited

PUBLICATIONS

English translation for JP-2009082790-A, Sasaki et al (Year: 2009).*

* cited by examiner

*Primary Examiner* — Nathan L Van Sell
(74) *Attorney, Agent, or Firm* — WOMBLE BOND DICKINSON (US) LLP; Joseph Bach, Esq.

(57) ABSTRACT

A method for forming thin film layer having micro-voids therein. The method proceeds by dispersing micro-particles over the surface of a substrate. The micro particles are made of sublimable material. Then the thin film layer is formed over the surface, so as to cover the particles. The thin film is then etched back so as to expose the particles at least partially. The material of the particles is then sublimed, e.g., by heating the substrate, thereby leaving micro-voids inside the thin film layer. The micro voids can be filled or remain exposed to generate textured surface.

13 Claims, 3 Drawing Sheets

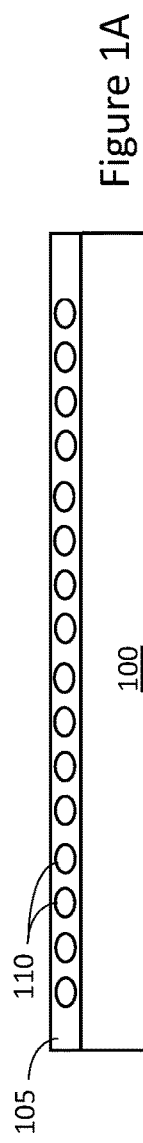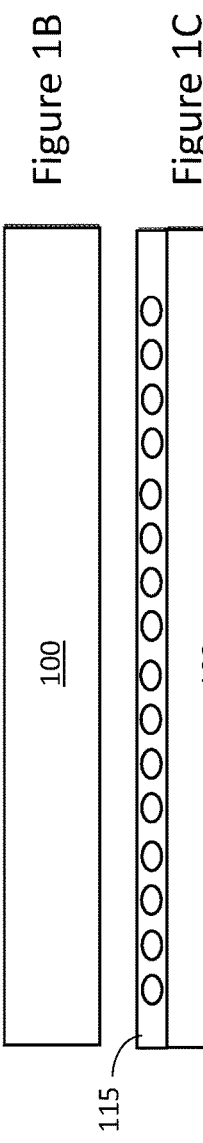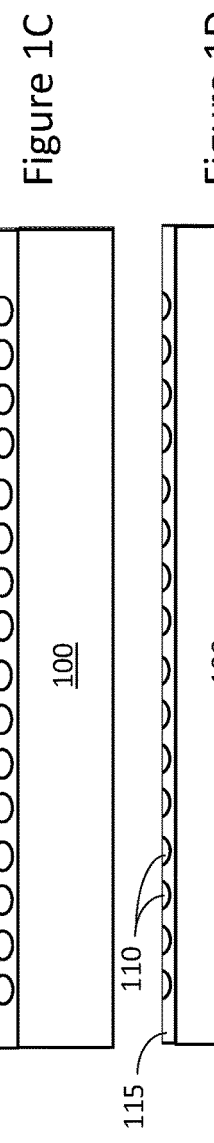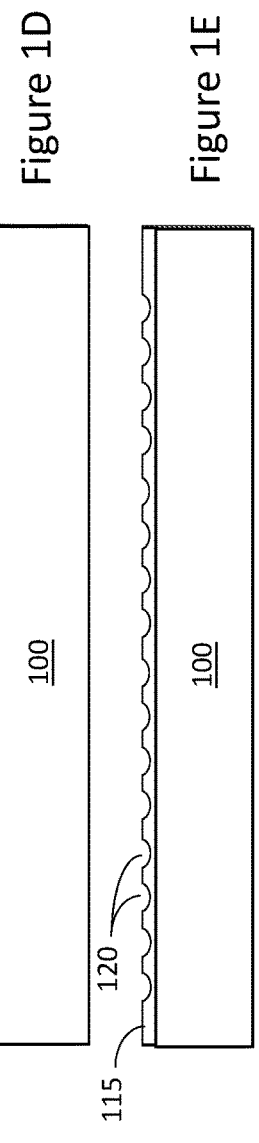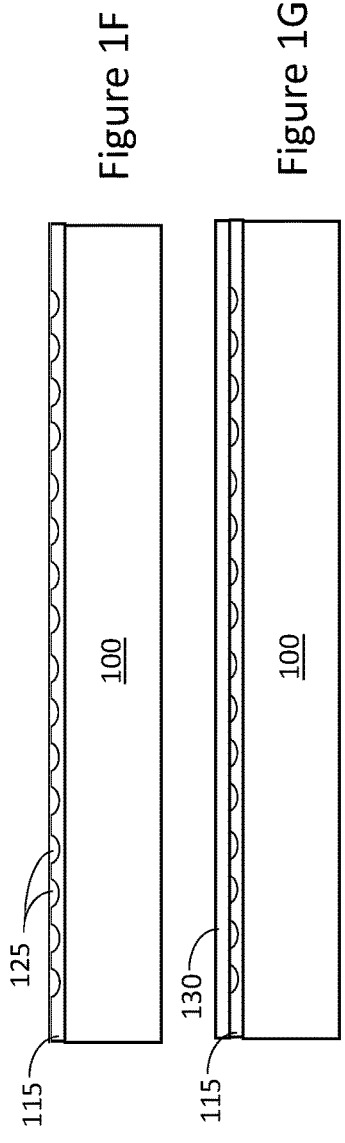

CREATION OF DISTRIBUTED VOIDS IN THIN FILMS

RELATED APPLICATIONS

This Application relates to and claims priority benefit from U.S. Provisional Application No. 62/704,317, filed May 4, 2020, the disclosure of which is incorporated herein by reference in its entirety.

BACKGROUND

1. Field

This disclosure relates to thin films that are generally fabricated in vacuum chambers using processes such as chemical or physical vapor deposition, atomic layer deposition, etc., and, more specifically, the intentional making voids within these films.

2. Related Art and Problem Being Solved

Thin films are used in various industries, such as the electronics industry, the ornamental coating industry, material property enhancement industry, etc. Thin film is generally defined as a layer of material having thickness ranging from fractions of a nanometer (monolayer) to several micrometers. There are occasions where it is desired to create micro-voids within the thin films. Generally, voids or patterns in thin film are made by wet or dry etching with the use of photolithography or hard masks. Each of these methods have its advantages and disadvantages. Photolithography is generally an expensive and time consuming process and plasma dry etching requires relatively expensive equipment. Wet etching is cheaper, but is more difficult to control.

Accordingly, there is a need for a process for creating micro voids in thin films which is relatively inexpensive and can be controlled better than wet etching.

SUMMARY

The following summary is included in order to provide a basic understanding of some aspects and features of the invention. This summary is not an extensive overview of the invention and as such it is not intended to particularly identify key or critical elements of the invention or to delineate the scope of the invention. Its sole purpose is to present some concepts of the invention in a simplified form as a prelude to the more detailed description that is presented below.

Disclosed aspects involve a method for creating texturing in thin films via micro voids formed in the film. If desired, the micro voids may then be filled with other material.

In some embodiments, the method proceeds by dispersing micro-particles over the surface of a substrate. The micro particles are made of sublimable material. Then the thin film layer is formed over the surface, so as to cover the particles. The thin film is then etched back so as to expose the particles at least partially. The material of the particles is then sublimed, e.g., by heating the substrate, thereby leaving micro-voids inside the thin film layer. The micro voids can be filled or remain exposed to generate textured surface.

According to disclosed aspects, a mobile device includes a frame supporting a back glass, the back glass having a thin film layer formed on a surface of the back glass, the thin film layer including a plurality of voids incorporated therein, each of the plurality of voids having a diameter of from 10 nm to 1000 µm.

According to other aspects, a method for forming on a substrate a layer of thin film having a plurality of voids is provided, comprising: dispersing on a surface of the substrate a plurality of particles made of a sublimable material and having a diameter no larger than 1000 µm; forming a thin film layer over the surface of the substrate to a thickness that covers the particles; etching back the thin film layer to expose the particles at least partially; and, sublimating the particles to thereby create voids within the thin film layer.

BRIEF DESCRIPTION OF THE DRAWINGS

The accompanying drawings, which are incorporated in and constitute a part of this specification, exemplify the embodiments of the present invention and, together with the description, serve to explain and illustrate principles of the invention. The drawings are intended to illustrate major features of the exemplary embodiments in a diagrammatic manner. The drawings are not intended to depict every feature of actual embodiments nor relative dimensions of the depicted elements, and are not drawn to scale.

One or more embodiments of the present invention are illustrated by way of example and not limitation in the figures of the accompanying drawings, in which like references indicate similar elements and in which:

FIGS. 1A-1G illustrate a flow chart showing the steps of a process according to one embodiment;

DETAILED DESCRIPTION

Figure 3:
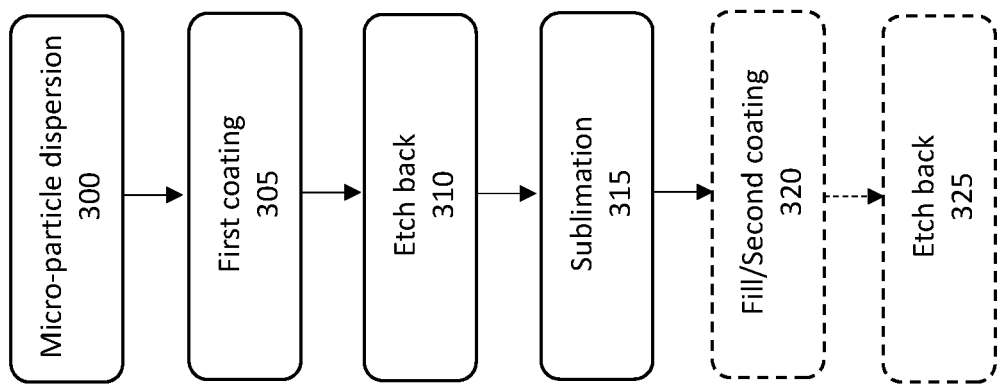
FIG. 3 is a flow chart illustrating general steps of a process according to one embodiment.

Embodiments of the inventive textured thin film will now be described with reference to the drawings. Different embodiments or their combinations may be used for different applications or to achieve different benefits. Depending on the outcome sought to be achieved, different features disclosed herein may be utilized partially or to their fullest, alone or in combination with other features, balancing advantages with requirements and constraints. Therefore, certain benefits will be highlighted with reference to different embodiments, but are not limited to the disclosed embodiments. That is, the features disclosed herein are not limited to the embodiment within which they are described, but may be "mixed and matched" with other features and incorporated in other embodiments.

The following embodiments disclose a process for creating nano to micron-sized holes in a thin film coating, generally for short referred to herein as micro voids or micro holes, but encompassing holes having several nanometer, e.g., 10 nm, or several micrometer, e.g., 1000 µm, diameter. In some examples, the particles were of diameter selected from 100 nm up to about 500 µm. In some embodiments the particles are of uniform diameter, e.g., no higher than 10% variability, while in other embodiments particles of different diameters are used to provide an effect that is non-uniform locally, but seems uniform globally. The resulting textured surface may be used as ornamental design or to generate a desired optical or haptic effect. Additionally, the voids may be filled with different materials to obtain different results, as will be described below with reference to embodiments.

Generally, the method proceeds by distributing particles on the surface of the substrate to be coated. In one example distributing the particles is achieved by suspending the particles of a desired feature size in a chemical liquid, and spreading the liquid over the substrate to be coated. The suspension liquid may be then removed by evaporation or other methods, leaving only the particles on the surface of the substrate. The particles are made of material which sublimes at elevated temperature. Examples may be particles made of iodine, naphthalene, cadmium and zinc.

The substrate with the particles is then introduced into a vacuum deposition system where a thin film is deposited over the particles, coating the particles and the substrate's surface. After the deposition process, the deposited film is partially etched back to expose the surface of the particles. The depth of the etching determines how much of the particles is exposed and the thickness of the remaining deposited film. Heat from the etching process may cause the particles to sublime without further added heating. If a portion of the particles still remains, the next step would be to heat the substrate, driving off the remaining particles and leaving voids in the deposited film. Depending on the desired functionality of the final film, the surface and voids can be coated and/or filled via an in situ or ex situ deposition step.

One benefit of creating the voids is in the improvement of fracture strength of the underlying substrate. The interruption of the stress in the underlying substrate or film on the substrate will improve the fracture strength. Also fractures or damage cannot propagate easily thru the voids as the voids will not transfer the energy causing the damage to adjacent material. The voids can be left unfilled or they can be filled with a plastic material which will absorb the energy thus reducing any damage.

To fill the voids and/or coat the substrate, the following processes may be employed. For example, sputtering may be used to form a thin film such as, e.g., PTFE, PET, DLC, SiyNx, SiOx. Evaporation process may be used to deposit films such as anti-smug material like fluoroalkylsilanes (FAS). Low viscosity liquid may be used to form coatings which coat the surface but do not fill the voids, while high viscosity liquids may be used to form coating which does fill the voids.

In an embodiment, particles of size, e.g., 20 nm to 5 μm are dispersed over the surface of a substrate. FIG. 1A illustrate substrate 100 having evaporative liquid 105, e.g., deionized (DI) water, having the particles 110 suspended therein. The liquid may be distributed over the entire surface of the substrate or only on part of it, in any desired design or pattern. The liquid 105 is then evaporated so that only the particles remain dispersed on the surface of the substrate 100, as shown in FIG. 1B. Alternatively, the particles may simply be dispersed over the surface as shown in FIG. 1B.

The substrate with the particles may then be placed in a deposition chamber and a thin film layer 115 is deposited over the particles 110, as shown in FIG. 1C. The thin film layer 115 may be a dielectric film, a metal film or a plastic film. The film 115 may be made of dielectrics such as silicon oxide, silicon nitride, ceramic such as alumina ($Al_2O_3$), titanium-dioxide ($TiO_2$), diamond-like carbon (DLC), such as tetrahedral amorphous carbon (ta-C), etc. The film 115 may be made of metals such as aluminum, silver, gold, tungsten, titanium, tantalum, platinum, etc. The film 115 may be made of plastic, such as fluorinated ethylene propylene (FEP), Polytetrafluoroethylene (PTFE), etc.

The deposited layer 115 is then etched back, including etching part of the particles 110, as shown in FIG. 1D. This exposes the particles material to enable the next step, which is sublimation of the particles 110 material, resulting in voids 120 as shown in FIG. 1E. The etch process may be wet etch, using liquid etchants, or may be dry etch using reactive and/or sputtering plasma. Reactive plasma may include, e.g., oxygen or chlorine species, while sputtering plasma may include argon species. Alternatively, the process of chemical-mechanical polishing (CMP) may be used to etch back the layer 115 and particles 110.

The sublimation may occur spontaneously due to the energy invested during the etch-back process. Conversely, the sublimation may be caused in a separate process by heating the substrate. In yet another embodiment the etching is performed while the substrate is heated, so sublimation is enhanced during the etching process.

At this point the substrate includes a coating that has micro voids in its surface. This may be the final product, if that's the effect required. For example, the coated substrate may be a glass plate serving as the back of a mobile phone wherein the micro voids generates a matt appearance.

Conversely, the substrate may be processed further to provide additional features. For example, the voids may be filled with various materials 125, e.g., anti-finger print material, such as fluoroalkylsilanes (FAS), as shown in FIG. 1F. Other materials may be used to fill the voids include plastics such as PTFE and PET, diamond-like carbon (DLC), silicon nitride (SiyNx), silicon oxide (SiOx), etc.

Also, as shown in FIG. 1G, a second thin film layer 130 may be formed over the first layer 115, either of the same or different material 125 as that used to fill the voids 120. Conversely, layer 130 may be formed over the particle layer without filling the voids 120. The second layer may be formed of dielectrics such as silicon oxide, silicon nitride, ceramic such as alumina ($Al_2O_3$), titanium-dioxide ($TiO_2$), diamond-like carbon (DLC), such as tetrahedral amorphous carbon (ta-C), etc. The film 130 may be made of metals such as aluminum, silver, gold, tungsten, titanium, tantalum, platinum, etc. The film 130 may be made of plastic, such as fluorinated ethylene propylene (FEP), Polytetrafluoroethylene (PTFE), etc.

Figure 2:
FIG. 2 is an illustration of the backside of a mobile device according to an embodiment.

FIG. 2 illustrates a mobile phone 200, with the back of the phone facing the viewer. The back of the phone is made of a glass plate 210, e.g., treated glass, such as Gorilla Glass, which is required in order to enable wireless charging. Glass 210 is coated according to any of the embodiments disclosed herein, having filled or unfilled micro voids 220. The voids may be filled with a material having different color than the overall color of glass 210, thereby adding ornamental design and enhancing concealment of the internals of the phone. The coating may be used, in part, to conceal the internal circuitry of the phone and provide different haptic feel that's less slippery.

FIG. 3 is a flow chart illustrating the general steps of the coating process. At step 300 the micro-particles are dispersed over the surface of the substrate to be coated. The particles may be dispersed by any suitable method, whether using evaporative liquid or not. In step 305 a first thin film layer is formed over the substrate, covering the particles which become embedded within the thin film. At step 310 the thin film is etched back so as to partially expose the particles. The sublimation step 315 may be performed simultaneously with or following the etch back step 310, sublimating the material of the particles, thereby leaving textured surface of the thin film. Optionally, step 320 is then followed for either filling the micro voids left by the sublimed particles or actually forming a second coating. If a second layer was formed in step 320, optionally the second layer may be etched back in step 325 so as to either smooth the final surface or to leave the material of the second layer only inside the voids, as shown in FIG. 1F.

Figure 5:
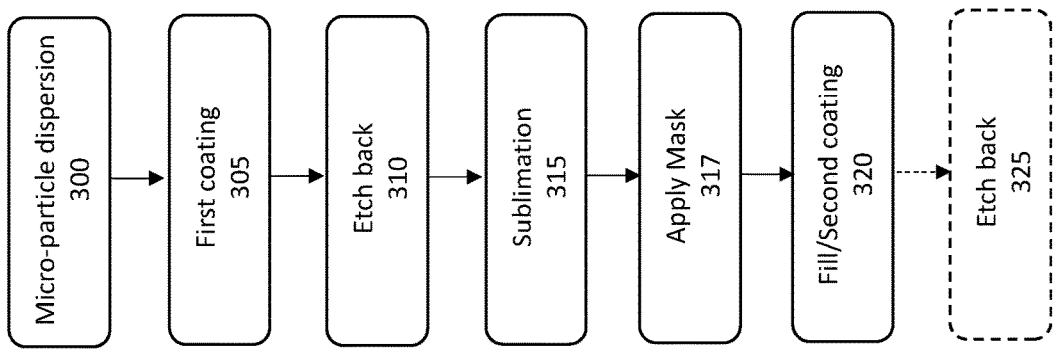
FIG. 5 is a flow chart illustrating general steps of a process according to one embodiment.
Figure 4:
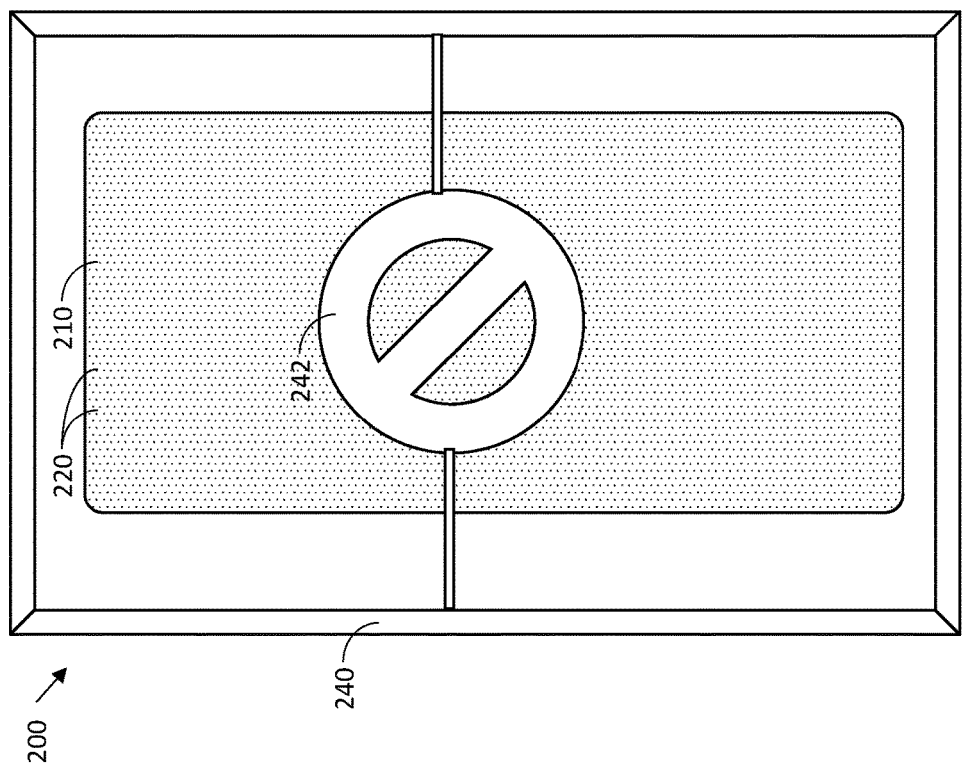
FIG. 4 is an illustration of a mask placed on the backside of a mobile device according to an embodiment.

FIG. 4 illustrates a substrate 210 to be used as the back of the phone, similar to that shown in FIG. 2. Additionally, a hard mask 240 is placed over the substrate, which has been formed with micro-void using any of the method disclosed herein. The hard mask 240 includes a design 242 which obscures part of the substrate. As shown in the flow chart of FIG. 5, the process for preparing the substrate 210 is similar to that illustrated in FIG. 3. However, in step 317 the mask 240 is placed over the substrate. Then in step 320 a second layer is formed over the substrate, but only in areas exposed by the mask 240. Consequently, the design 242 of mask 240 is transferred to the substrate, such that part of the voids can be filled while others not, or part may be filled with one material and others may be filled with a different material using, e.g., two complementary masks. After the second layer was formed in step 320, optionally the second layer may be etched back in step 325 so as to either smooth the final surface or to leave the material of the second layer only inside the voids, as shown in FIG. 1F.

It should be understood that processes and techniques described herein are not inherently related to any particular apparatus and may be implemented by any suitable combination of components. Further, various types of general purpose devices may be used in accordance with the teachings described herein. The present invention has been described in relation to particular examples, which are intended in all respects to be illustrative rather than restrictive. Those skilled in the art will appreciate that many different combinations will be suitable for practicing the present invention.

Moreover, other implementations of the invention will be apparent to those skilled in the art from consideration of the specification and practice of the invention disclosed herein. Various aspects and/or components of the described embodiments may be used singly or in any combination. It is intended that the specification and examples be considered as exemplary only, with a true scope and spirit of the invention being indicated by the following claims.

The invention claimed is:

1. A method for forming on a substrate a layer of thin film having a plurality of voids, comprising:
dispersing on a surface of the substrate a plurality of particles made of a sublimable material and having a diameter no larger than 1000 μm;
forming a thin film layer over the surface of the substrate to a thickness that covers the particles;
etching back the thin film layer to expose the particles at least partially; and,
sublimating the particles to thereby create voids within the thin film layer;
wherein the dispersing comprises suspending the particles in a vaporizable liquid and spreading the liquid over the surface, and thereafter evaporating the liquid.

2. The method of claim 1, wherein the particles are made from a material selected from iodine, naphthalene, cadmium and zinc.

3. The method of claim 1, wherein the liquid comprises deionized water.

4. The method of claim 1, wherein forming the thin film layer comprises depositing material selected from aluminum, silver, gold, tungsten, titanium, tantalum, platinum.

5. The method of claim 1, wherein forming the thin film layer comprises depositing material selected from fluorinated ethylene propylene (FEP), Polytetrafluoroethylene (PTFE).

6. The method of claim 1, further comprising depositing an anti-smug material over the thin film layer.

7. The method of claim 6, wherein the anti-smug material comprises fluoroalkylsilanes (FAS).

8. The method of claim 1, further comprising placing a mask over the thin film layer so that the mask obscures part of the thin film layer and depositing a second layer through the mask on exposed parts of the thin film layer.

9. The method of claim 8, further comprising etching back the second layer.

10. A method of forming on a substrate a layer of thin film having a plurality of voids, comprising:
dispersing on a surface of the substrate a plurality of particles made of a sublimable material and having a diameter no larger than 1000 μm;
forming a thin film layer over the surface of the substrate to a thickness that covers the particles;
etching back the thin film layer to expose the particles at least partially; and,
sublimating the particles to thereby create voids within the thin film layer;
wherein forming the thin film layer comprises depositing material selected from silicon oxide, silicon nitride, alumina ($Al_2O_3$), titanium-dioxide ($TiO_2$), diamond-like carbon (DLC).

11. The method of claim 10, wherein the dispersing comprises suspending the particles in a vaporizable liquid and spreading the liquid over the surface, and thereafter evaporating the liquid.

12. A method of forming on a substrate a layer of thin film having a plurality of voids, comprising:
dispersing on a surface of the substrate a plurality of particles made of a sublimable material and having a diameter no larger than 1000 μm;
forming a thin film layer over the surface of the substrate to a thickness that covers the particles;
etching back the thin film layer to expose the particles at least partially;
sublimating the particles to thereby create voids within the thin film layer;
and filling the voids with material different from the thin film layer.

13. The method of claim 12, wherein the filling comprises depositing a second layer over the thin film layer and etching back the second layer.

* * * * *